(12) United States Patent
Wang et al.

(10) Patent No.: US 8,002,436 B2
(45) Date of Patent: Aug. 23, 2011

(54) LED CHIP PACKAGE STRUCTURE USING A SUBSTRATE AS A LAMPSHADE AND METHOD FOR MAKING THE SAME

(75) Inventors: Bily Wang, Hsinchu (TW); Shih-Yu Wu, Taipei County 220 (TW); Wen-Kuei Wu, Hsinchu County 303 (TW)

(73) Assignee: Harvatek Corportion, Hsinchu (TW)

( * ) Notice: Subject to any disclaimer, the term of this patent is extended or adjusted under 35 U.S.C. 154(b) by 434 days.

(21) Appl. No.: 12/243,026

(22) Filed: Oct. 1, 2008

(65) Prior Publication Data
US 2009/0261368 A1 Oct. 22, 2009

(30) Foreign Application Priority Data
Apr. 16, 2008 (TW) ............... 97113816 A

(51) Int. Cl.
*F21S 4/00* (2006.01)
*F21V 21/00* (2006.01)

(52) U.S. Cl. ......... 362/249.04; 362/249.02; 362/249.08; 257/E21.499; 257/98; 257/E33.056

(58) Field of Classification Search ............... 362/235, 362/249.01–249.04, 249.06–249.08, 296.02, 362/296.04; 257/98, 99, E33.056, E33.057, 257/E33.068, E21.499, E33.067
See application file for complete search history.

(56) References Cited

U.S. PATENT DOCUMENTS

| 7,506,997 B1 * | 3/2009 | Eriksson ............... 362/241 |
| 2008/0100772 A1 * | 5/2008 | Lin et al. ............... 349/61 |
| 2008/0128739 A1 * | 6/2008 | Sanpei et al. ............ 257/99 |

\* cited by examiner

*Primary Examiner* — Thomas M Sember
(74) *Attorney, Agent, or Firm* — Rosenberg, Klein & Lee

(57) ABSTRACT

An LED chip package structure using a substrate as a lampshade includes a substrate unit and a light-emitting unit. The substrate unit has a substrate body with a lampshade shape. The light-emitting unit has a plurality of light-emitting elements electrically disposed on an inner surface of the substrate body. Therefore, one part of light beams projected by the light emitting elements is reflected out of the lampshade by the inner surface of the substrate body.

6 Claims, 11 Drawing Sheets

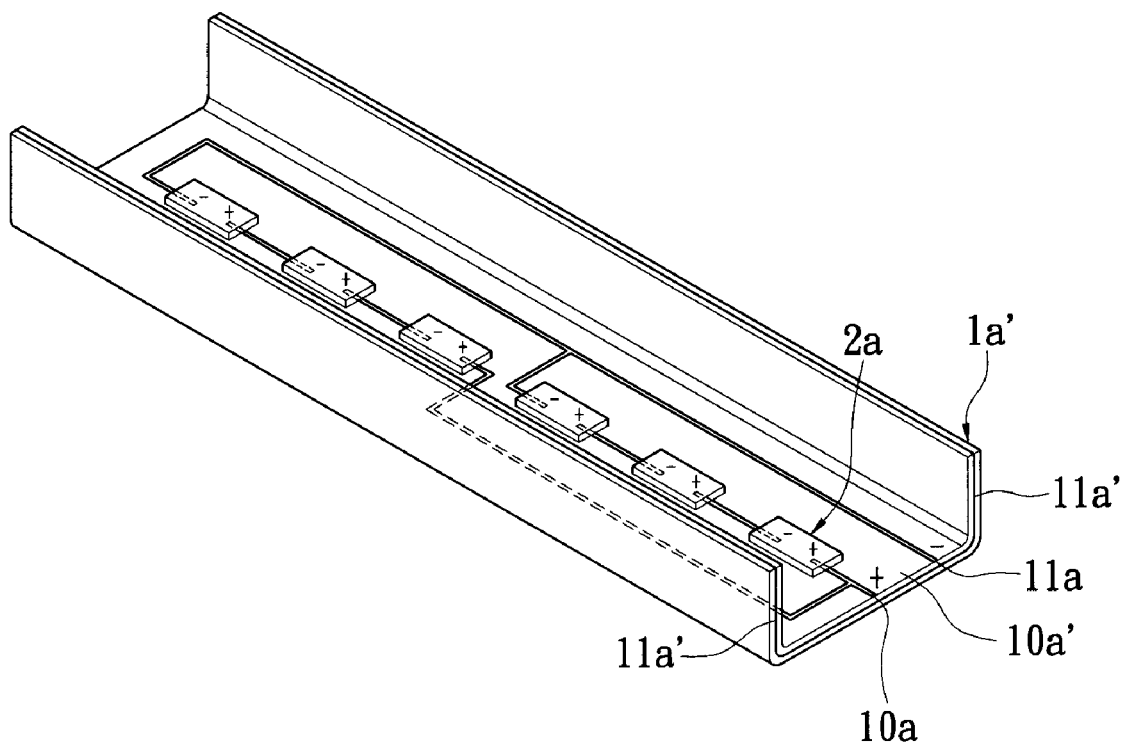
FIG. 2C1
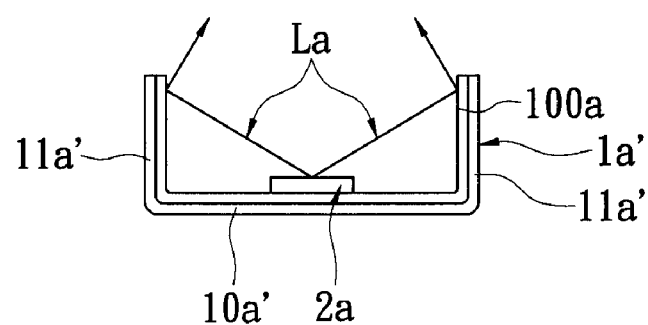
FIG. 2C2

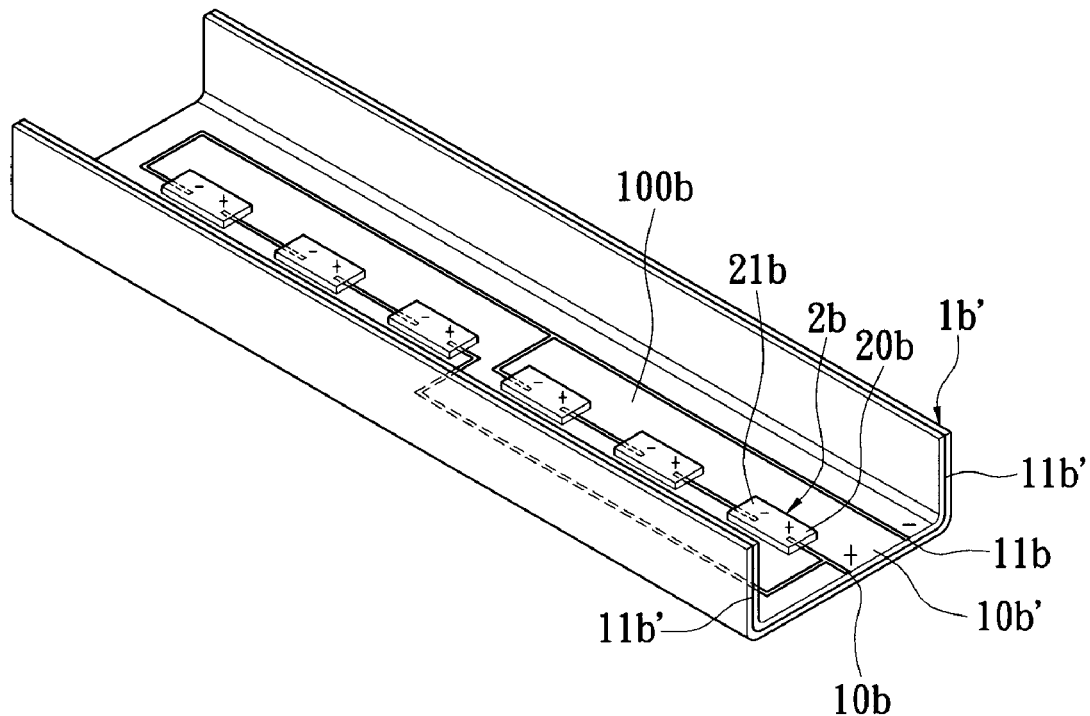
FIG. 3C1
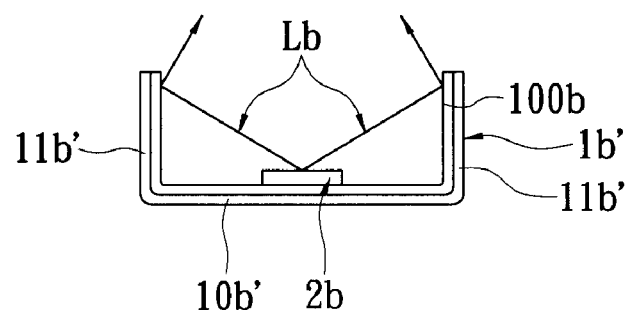
FIG. 3C2

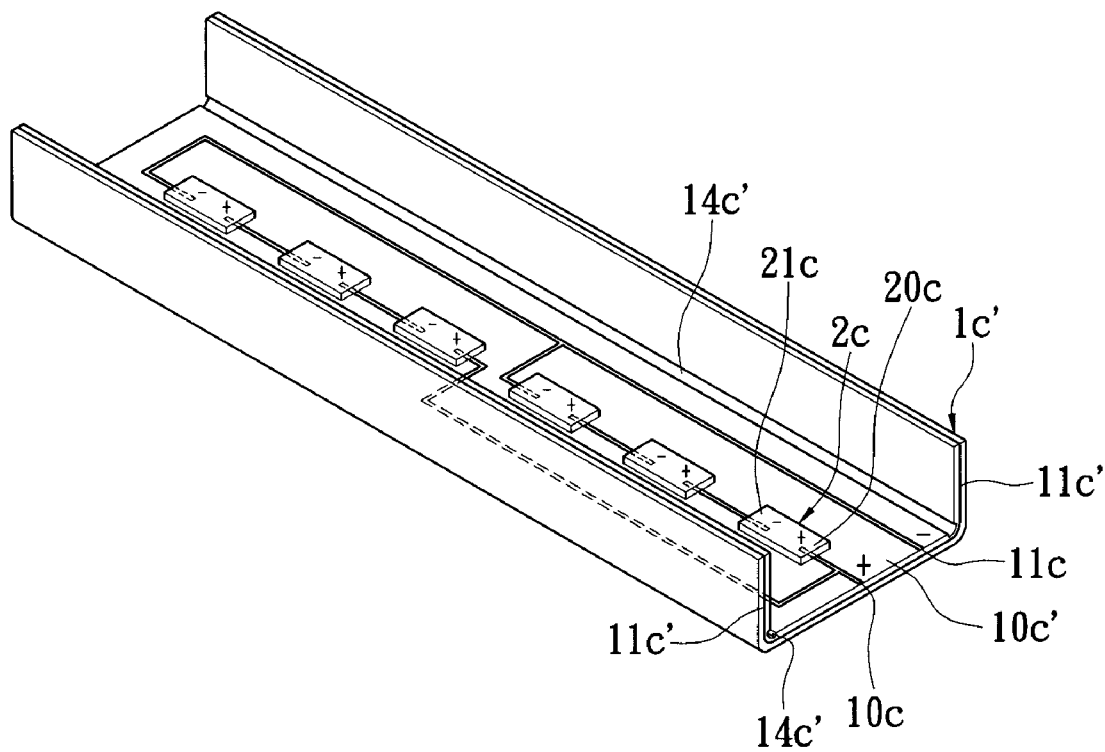
FIG. 4C1
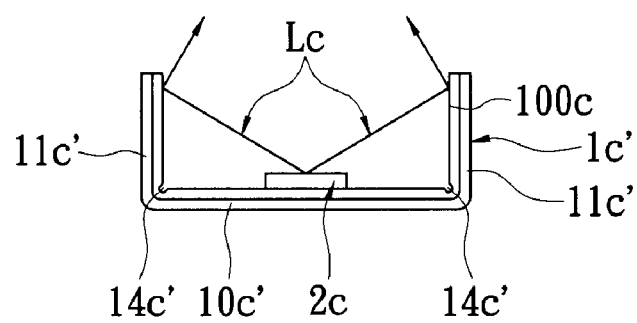
FIG. 4C2

LED CHIP PACKAGE STRUCTURE USING A SUBSTRATE AS A LAMPSHADE AND METHOD FOR MAKING THE SAME

BACKGROUND OF THE INVENTION

1. Field of the Invention

The present invention relates to an LED chip package structure and a method for making the same, and particularly relates to an LED chip package structure using a substrate as a lampshade and a method for making the same.

2. Description of Related Art

FIG. 1 shows a lateral, schematic view of an LED package structure disposed inside a lampshade according to the prior art. The LED package structure of the prior art includes: a substrate body S and at least one light-emitting element L electrically disposed on the substrate body S. The substrate body S has a heat-conductive layer S1, an insulative layer S2 formed on the heat-conductive layer S1, and a conductive layer S3 formed on the insulative layer S2. Hence, the light-emitting element L is electrically connected to a power source (not shown) via the conductive layer S3, and the heat generated by the light-emitting element L passes through the insulative layer S2 and the heat-conductive layer S1 in sequence in order to dissipate the heat of the light-emitting element L.

The LED package structure of the prior art is disposed inside a lampshade U via an adhesive layer A in order to condense one part of light beams B generated by the light-emitting element L. Hence, one part of light beams B projected by the light emitting element L is reflected out of the lampshade by the inner surface U10 of the lampshade U.

However, the process for disposing the LED package structure inside the lampshade U is complex. In addition, the heat generated by the light-emitting element L needs to pass through the substrate body S (the insulative layer S2 and the heat-conductive layer S1) and the adhesive layer A in order to transmit the heat to the lampshade U. Hence, the heat-dissipating speed and efficiency of the light-emitting element L are decreased.

SUMMARY OF THE INVENTION

The present invention provides an LED chip package structure using a substrate as a lampshade and a method for making the same. The present invention directly bends a substrate body with plane shape into a substrate body with lampshade shape as a lampshade for an LED chip package structure. Hence, the present invention not only can omit the process for manufacturing the lampshade of the prior art, but also can use the substrate body composed of a metal layer and a Bakelite layer with high heat-transmitting efficiency in order to increase the heat-dissipating effect.

One aspect of the present invention is an LED chip package structure using a substrate as a lampshade, including: a substrate unit and a light-emitting unit. The substrate unit has a substrate body with a lampshade shape. The light-emitting unit has a plurality of light-emitting elements electrically disposed on an inner surface of the substrate body. Therefore, one part of light beams projected by the light emitting elements is reflected out of the lampshade by the inner surface of the substrate body.

One aspect of the present invention is a method for making an LED chip package structure using a substrate as a lampshade, including: providing a substrate body with a plane shape; electrically arranging a plurality of light-emitting elements on an inner surface of the substrate body with the plane shape; and bending the substrate body with the plane shape in order to change the shape of the substrate body from the plane shape into a lampshade shape, so that one part of light beams projected by the light emitting elements is reflected out of the lampshade by an inner surface of the substrate body with lampshade shape.

One aspect of the present invention is a method for making an LED chip package structure using a substrate as a lampshade, including: providing a substrate body with a plane shape; bending the substrate body with the plane shape in order to change the shape of the substrate body from the plane shape into a lampshade shape; and electrically arranging a plurality of light-emitting elements on an inner surface of the substrate body with lampshade shape, so that one part of light beams projected by the light emitting elements is reflected out of the lampshade by an inner surface of the substrate body with lampshade shape.

Hence, the substrate body with plane shape can be directly bent into the substrate body with lampshade shape as a lampshade applied to the LED chip package structure. Hence, the present invention not only can omit the process for manufacturing the lampshade of the prior art, but also can use the substrate body composed of a metal layer and a Bakelite layer with high heat-transmitting efficiency in order to increase the heat-dissipating effect.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIGS. 2A to 2C2 are perspective, schematic views of an LED chip package structure using a substrate as a lampshade according to the first embodiment of the present invention, at different stages of the packaging processes, respectively;

FIGS. 3A to 3C2 are perspective, schematic views of an LED chip package structure using a substrate as a lampshade according to the second embodiment of the present invention, at different stages of the packaging processes, respectively;

FIGS. 4A to 4C2 are perspective, schematic views of an LED chip package structure using a substrate as a lampshade according to the third embodiment of the present invention, at different stages of the packaging processes, respectively;

DETAILED DESCRIPTION OF PREFERRED EMBODIMENTS

Figure 2:
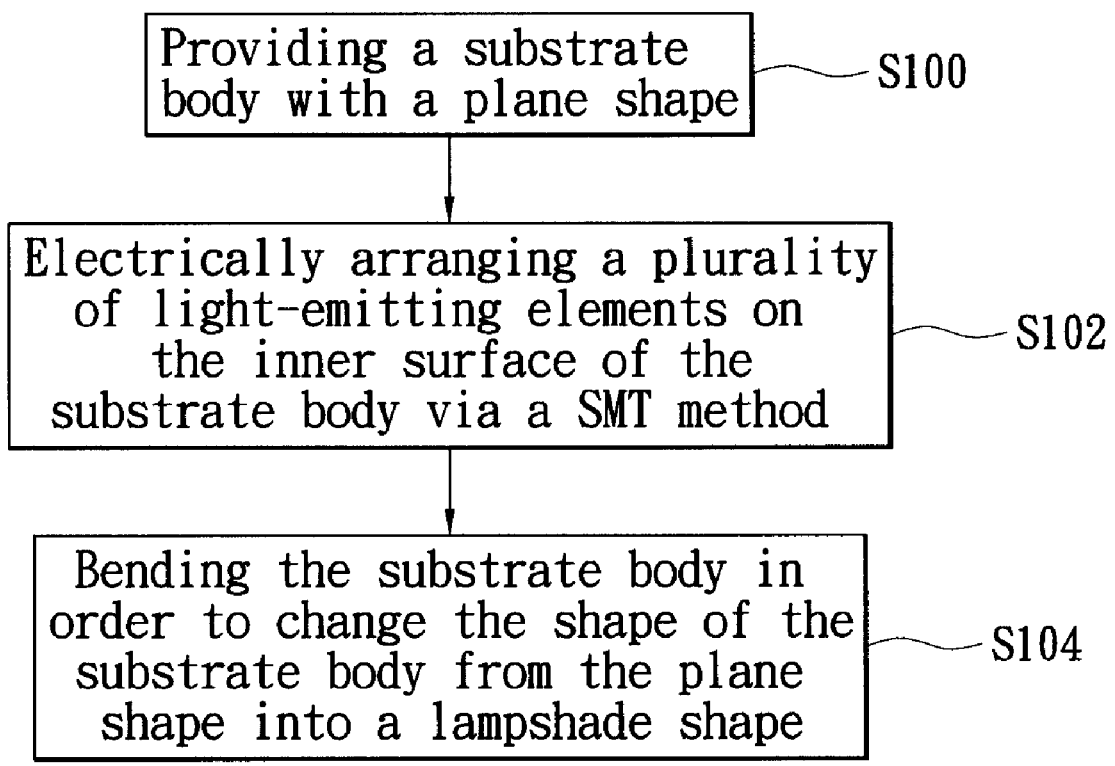
FIG. 2 is a flowchart of a method for making an LED chip package structure using a substrate as a lampshade according to the first embodiment of the present invention.
Figure 2A:
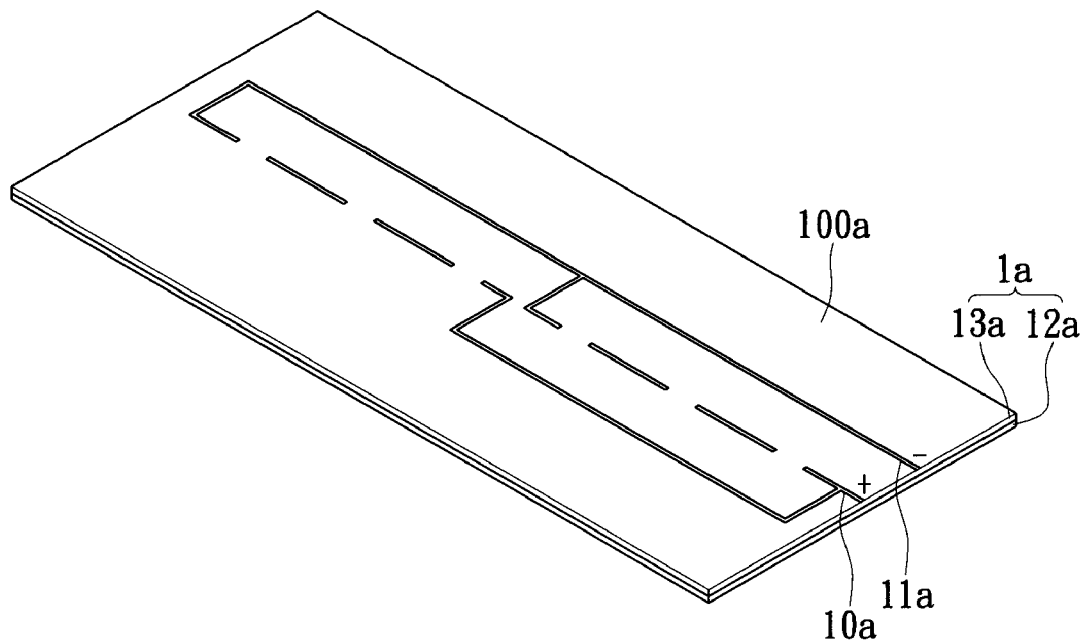

Referring to FIGS. 2 and 2A to 2C2, the first embodiment of the present invention provides a method for making an LED chip package structure using a substrate as a lampshade.

The method of the present invention includes: referring to FIGS. 2 and 2A, providing a substrate body 1a with a plane shape (S100). The substrate body 1a has a positive trace 10a and a negative trace 11a respectively formed on the inner surface 100a of the substrate body 1a. The substrate body 1a has a metal layer 12a and a Bakelite layer 13a formed on the metal layer 12a. Both the positive trace 10a and the negative trace 11a can be aluminum circuits or silver circuits. In addition, the substrate body 1a can be a PCB (Printed Circuit Board), a flexible substrate, an aluminum substrate, a ceramic substrate, or a copper substrate.

Figure 2B:
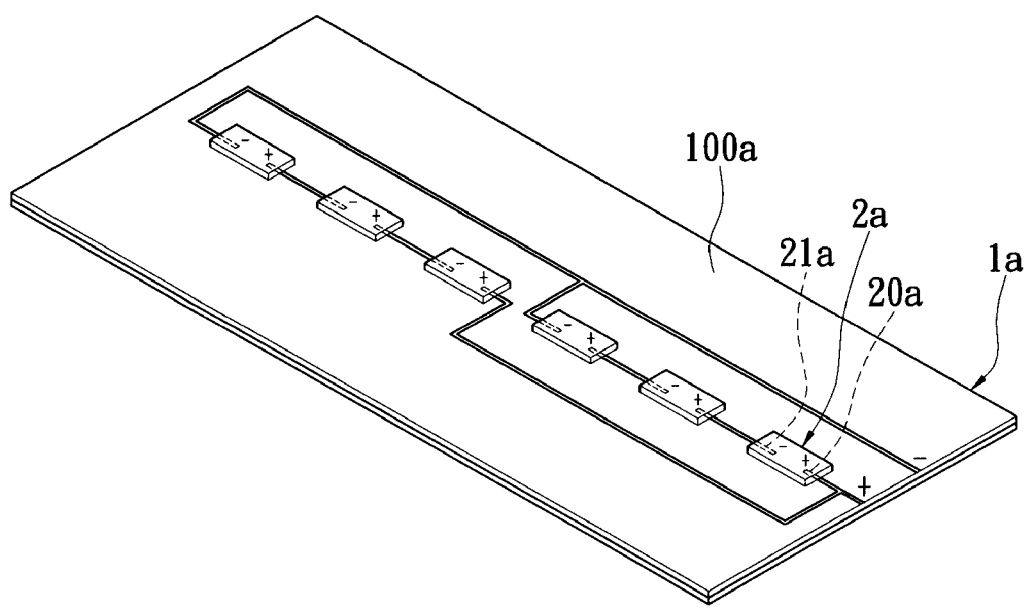

Referring to FIGS. 2 and 2B, the method further includes: electrically arranging a plurality of light-emitting elements 2a on the inner surface 100a of the substrate body 1a via a SMT (Surface Mounted Technology) method (S102). Each light-emitting element 2a has a positive side 20a and a negative side 21a respectively and electrically connected with the positive trace 10a and the negative trace 11a of the substrate body 1a.

Figure 1:
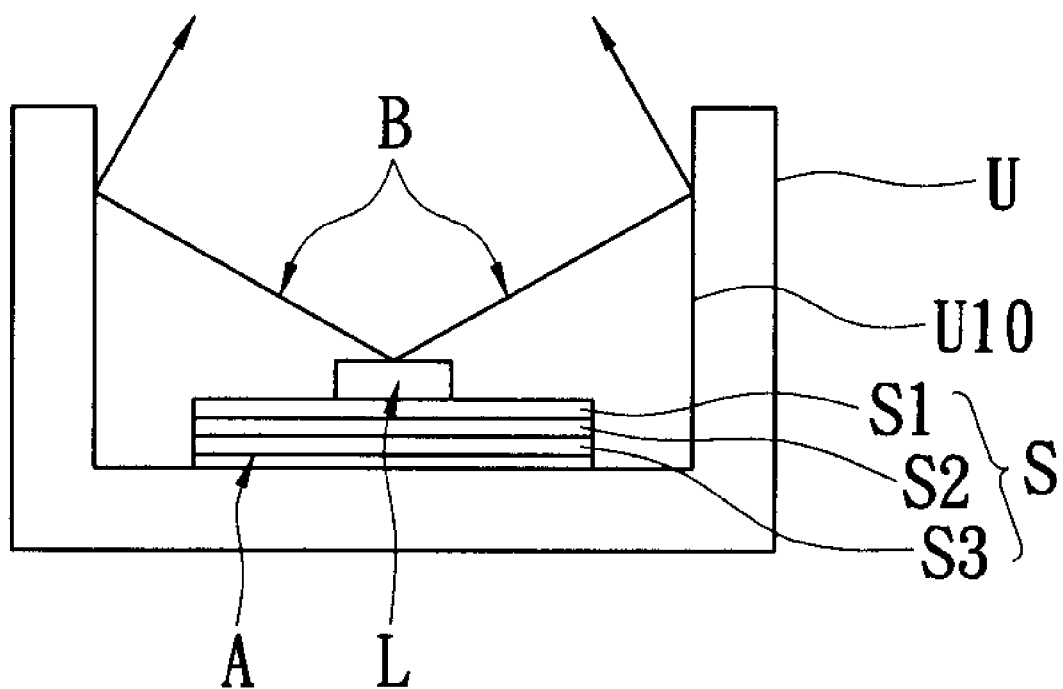
FIG. 1 is a lateral, schematic view of an LED package structure disposed inside a lampshade according to the prior art.

Referring to FIGS. 2, 2C1 and 2C2, the method further includes: bending the substrate body 1a in order to change the shape of the substrate body 1a from the plane shape into a lampshade shape (S104). In other words, the substrate body 1a is bent into a substrate body 1a' with lampshade shape, so that one part of light beams La projected by the light emitting elements 2a is reflected out of the lampshade by the inner surface 100a of the substrate body 1a' with lampshade shape. In addition, the lampshade shape is formed as a U-shape, and the substrate body 1a' with lampshade shape has a plane portion 10a' and two extending portions 11a' extending upwardly from two sides of the plane portion 10a'. Both the positive trace 10a and the negative trace 11a are formed on the inner surface 100a of the plane portion 10a'.

Referring to FIGS. 3 and 3A to 3C2, the second embodiment of the present invention provides a method for making an LED chip package structure using a substrate as a lampshade.

Figure 3:
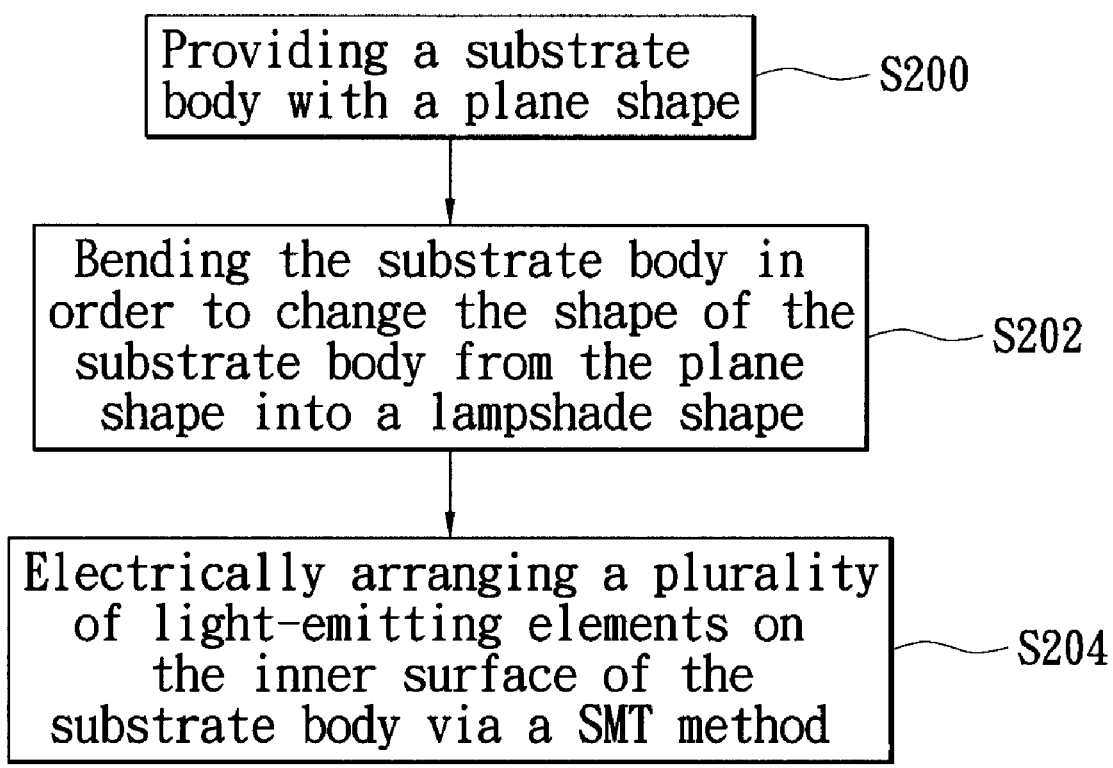
FIG. 3 is a flowchart of a method for making an LED chip package structure using a substrate as a lampshade according to the second embodiment of the present invention.
Figure 3A:
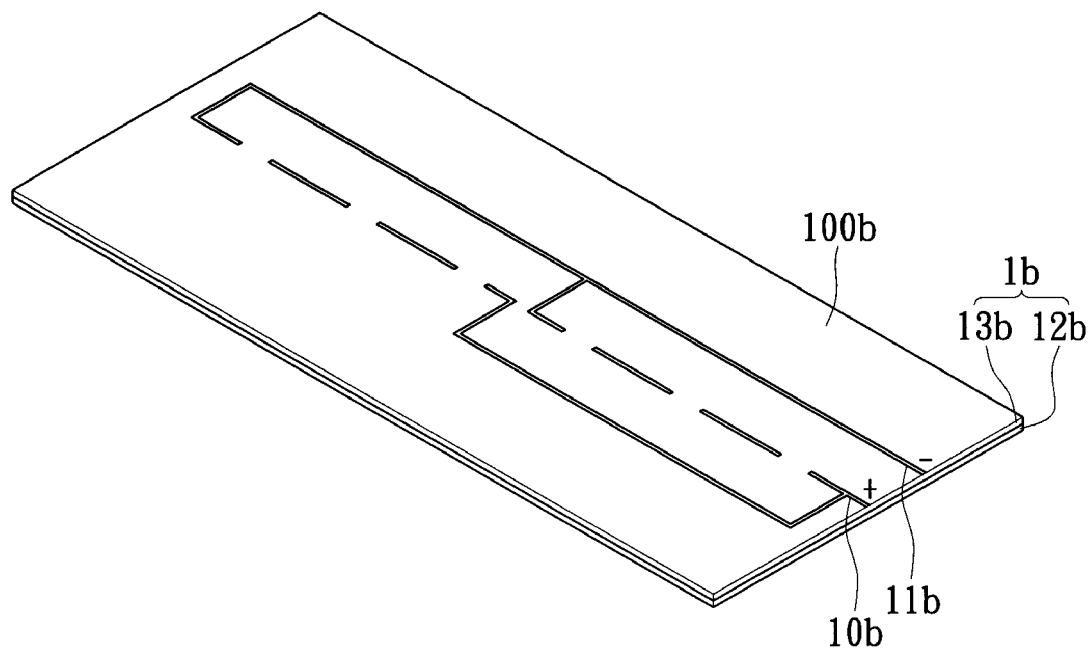

The method of the present invention includes: referring to FIGS. 3 and 3A, providing a substrate body 1b with a plane shape (S200). The substrate body 1b has a positive trace 10b and a negative trace 11b respectively formed on the inner surface 100b of the substrate body 1b. The substrate body 1b has a metal layer 12b and a Bakelite layer 13b formed on the metal layer 12b. Both the positive trace 10b and the negative trace 11b can be aluminum circuits or silver circuits. In addition, the substrate body 1b can be a PCB (Printed Circuit Board), a flexible substrate, an aluminum substrate, a ceramic substrate, or a copper substrate.

Figure 3B:
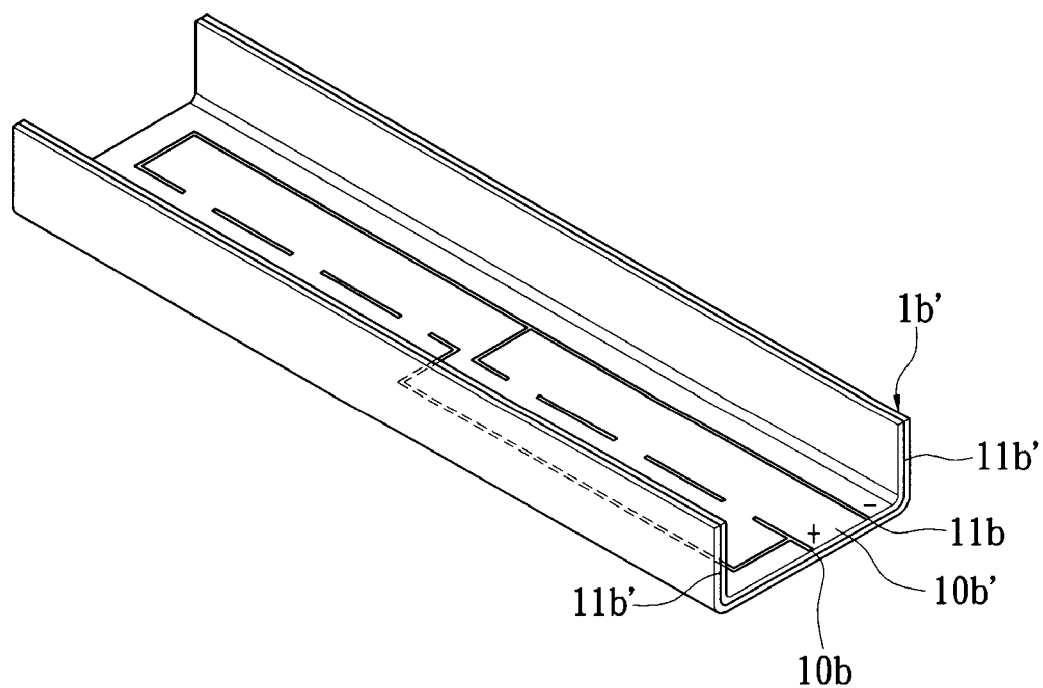

Referring to FIGS. 3 and 3B, the method further includes: bending the substrate body 1b in order to change the shape of the substrate body 1b from the plane shape into a lampshade shape (S202). In other words, the substrate body 1b is bent into a substrate body 1b' with lampshade shape. In addition, the lampshade shape is formed as a U-shape, and the substrate body 1b' with lampshade shape has a plane portion 10b' and two extending portions 11b' extending upwardly from two sides of the plane portion 10b'. Both the positive trace 10b and the negative trace 11b are formed on the inner surface of the plane portion 10b'.

Referring to FIGS. 3, 3C1 and 3C2, the method further includes: electrically arranging a plurality of light-emitting elements 2b on the inner surface 100b of the substrate body 1b' via a SMT (Surface Mounted Technology) method (S204). Hence, one part of light beams Lb projected by the light emitting elements 2b is reflected out of the lampshade by the inner surface 100b of the substrate body 1b' with lampshade shape. In addition, each light-emitting element 2b has a positive side 20b and a negative side 21b respectively and electrically connected with the positive trace 10b and the negative trace 11b of the substrate body 1b'.

The difference between the first embodiment and the second embodiment is that: in the first embodiment, the light-emitting elements 2a are electrically arranged on the inner surface 100a of the substrate body 1a firstly, and then the substrate body 1a with the plane shape is bent into the substrate body 1a' with lampshade shape; In the second embodiment, the substrate body 1b with the plane shape is bent into the substrate body 1b' with lampshade shape firstly, and then the light-emitting elements 2b are electrically arranged on the inner surface 100b of the substrate body 1b' with lampshade shape.

Therefore, the first embodiment and the second embodiment provide an LED chip package structure using a substrate as a lampshade, including: a substrate unit and a light-emitting unit. The substrate unit has a substrate body (1a', 1b') with a lampshade shape. The light-emitting unit has a plurality of light-emitting elements (2a, 2b) electrically disposed on the inner surface (100a, 100b) of the substrate body (1a', 1b'). Hence, one part of light beams (La, Lb) projected by the light emitting elements (2a, 2b) is reflected out of the lampshade by the inner surface (100a, 100b) of the substrate body (1a', 1b').

Referring to FIGS. 4 and 4A to 4C2, the third embodiment of the present invention provides a method for making an LED chip package structure using a substrate as a lampshade.

Figure 4:
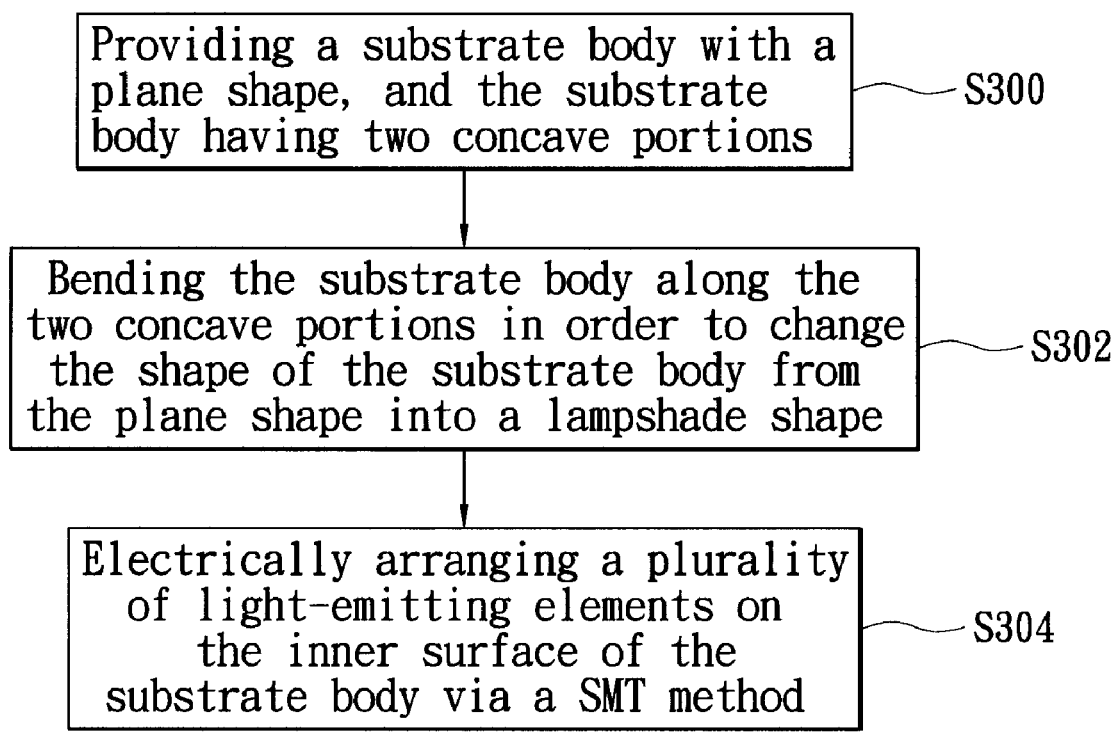
FIG. 4 is a flowchart of a method for making an LED chip package structure using a substrate as a lampshade according to the third embodiment of the present invention.
Figure 4A:
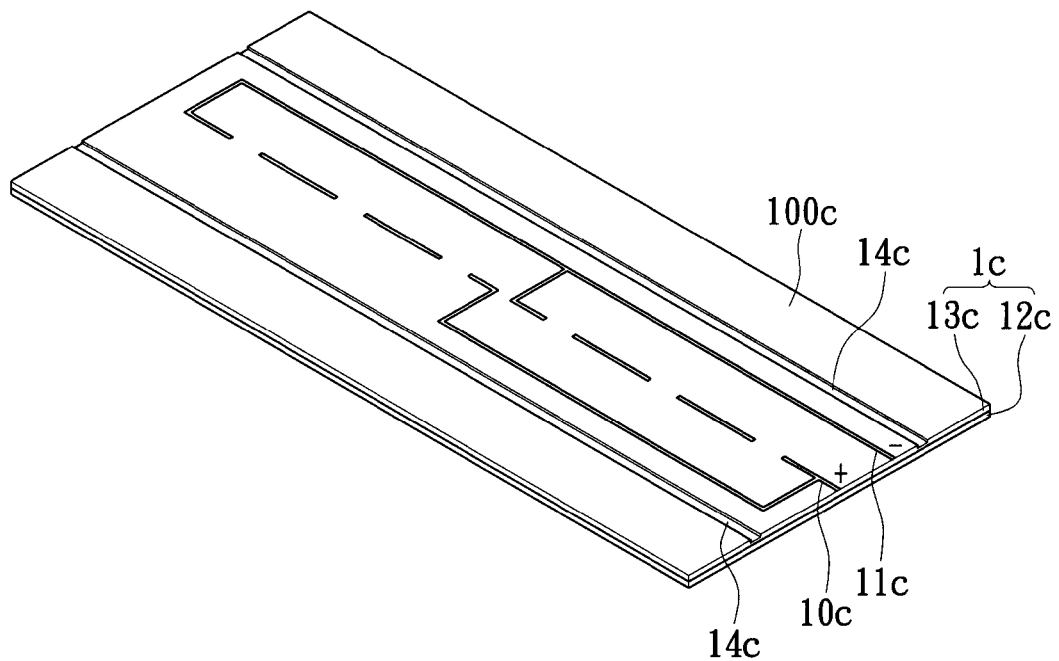

The method of the present invention includes: referring to FIGS. 4 and 4A, providing a substrate body 1c with a plane shape, and the substrate body 1c having two concave portions 14c (S300). The substrate body 1c has a positive trace 10c and a negative trace 11c respectively formed on the inner surface 100c of the substrate body 1c. The substrate body 1c has a metal layer 12c and a Bakelite layer 13c formed on the metal layer 12c. In addition, each concave portion 14c is a continuous concave groove.

Figure 4B:
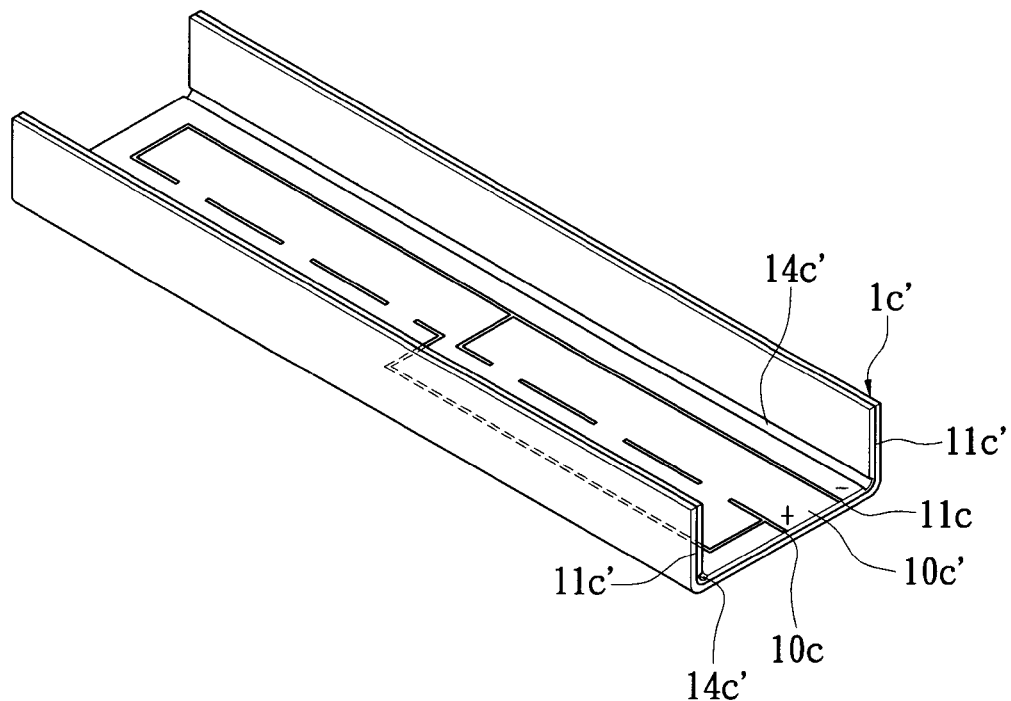

Referring to FIGS. 4 and 4B, the method further includes: bending the substrate body 1c along the two concave portions 14c in order to change the shape of the substrate body 1c from the plane shape into a lampshade shape (S302). In other words, the substrate body 1c is bent into a substrate body 1c' with lampshade shape, and the two concave portions 14c are bent into two bent concave portions 14c'. In addition, the lampshade shape is formed as a U-shape, and the substrate body 1c' with lampshade shape has a plane portion 10c' and two extending portions 11c' extending upwardly from two sides of the plane portion 10c'. Hence, each bent concave portion 14c' is formed between the plane portion 10c' and each extending portion 11c'. In addition, both the positive trace 10c and the negative trace 11c are formed on the inner surface of the plane portion 10c'.

Referring to FIGS. 4, 4C1 and 4C2, the method further includes: electrically arranging a plurality of light-emitting elements 2c on the inner surface 100c of the substrate body 1c' via a SMT (Surface Mounted Technology) method (S304).

Hence, one part of light beams Lc projected by the light emitting elements 2c is reflected out of the lampshade by the inner surface 100c of the substrate body 1c' with lampshade shape. In addition, each light-emitting element 2c has a positive side 20c and a negative side 21c respectively and electrically connected with the positive trace 10c and the negative trace 11c of the substrate body 1c'.

The difference between the third embodiment and the second embodiment is that: in the third embodiment, the two concave portions 14c are formed on the substrate body 1c firstly in order to bend the substrate body 1c along the two concave portions 14c as the step of S302. Hence, it is easy and convenient for the user to bent the substrate body 1c with the plane shape into the substrate body 1c' with lampshade shape by using the two concave portions 14c.

Figure 5:
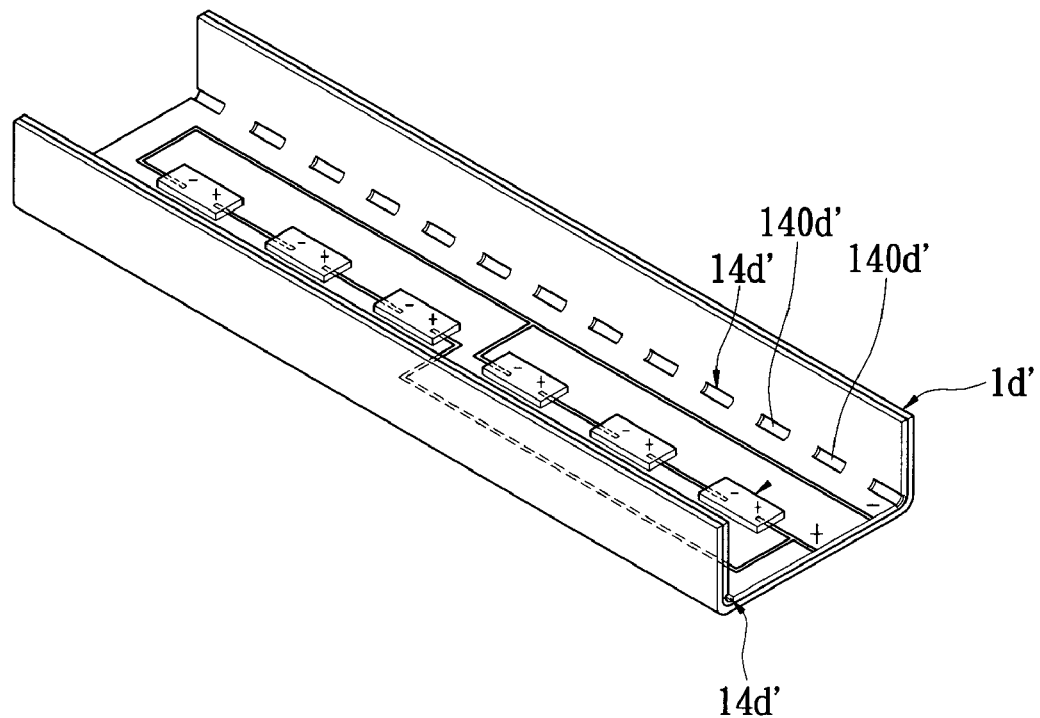
FIG. 5 is a perspective, schematic view of an LED chip package structure using a substrate as a lampshade according to the fourth embodiment of the present invention.

Referring to FIG. 5, the difference between the fourth embodiment and the third embodiment is that: each concave portion 14d' is composed of a plurality of concave grooves 140d' separated from each other. The advantage of the fourth embodiment is: two concave portions (not shown) are formed on the substrate body (not shown) with a plane shape firstly in order to bend the substrate body with the plane shape along the two concave portions 14d' into a substrate body 1d' with lampshade shape. Hence, it is easy and convenient for the user to bent the substrate body with the plane shape into the substrate body 1d' with lampshade shape by using the two concave portions 14d'.

Figure 6:
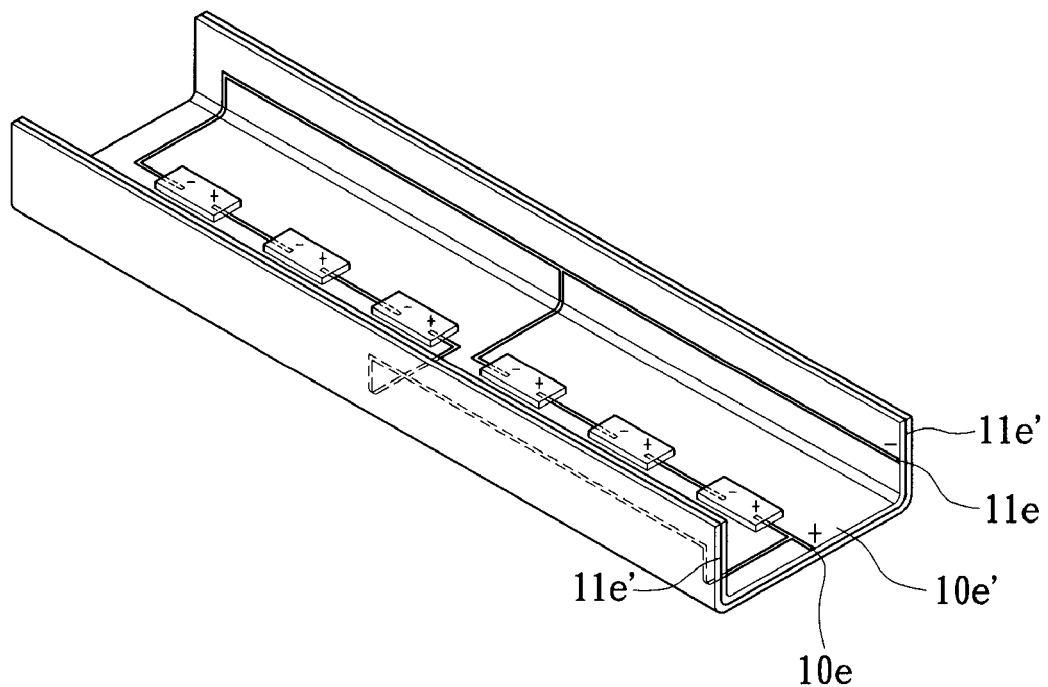
FIG. 6 is a perspective, schematic view of an LED chip package structure using a substrate as a lampshade according to the fifth embodiment of the present invention.

Referring to FIG. 6, the difference between the fifth embodiment and the second embodiment is that: in the fifth embodiment, both a positive trace 10e and a negative trace 11e are formed on an inner surface of a plane portion 10e' and an inner surface of the two extending portions 11e'.

In conclusion, the substrate body with plane shape can be directly bent into the substrate body with lampshade shape as a lampshade applied to the LED chip package structure. Hence, the present invention not only can omit the process for manufacturing the lampshade of the prior art, but also can use the substrate body composed of a metal layer and a Bakelite layer with high heat-transmitting efficiency in order to increase the heat-dissipating effect.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An LED chip package structure, comprising:
   a substrate unit including a substrate body having a fixed lampshade shape held without external frame, wherein the substrate body includes a plane portion, two extending portions extended upwardly from two opposite lateral sides of the plane portion, and two continuous concave portions respectively formed between the plane portion and one of the two extending portions and between the plane portion and the other extending portion, wherein the substrate body includes a positive trace and a negative trace, the positive trace is formed on the plane portion, one of the two extending portions, and one of the two continuous concave portions, and the negative trace is formed on the plane portion, the other extending portion, and the other continuous concave portion; and
   a light-emitting unit including a plurality of light-emitting bare chips disposed on the plane portion, wherein each light-emitting bare chip is electrically connected between the positive trace and the negative trace.

2. The LED chip package structure as claimed in claim 1, wherein the substrate body has a metal layer and a Bakelite layer formed on the metal layer.

3. A method for making an LED chip package structure, comprising the steps of:
   providing a substrate body with a plane shape providing a substrate body having a plane shape;
   placing a plurality of light-emitting bare chips on the substrate body, wherein the light-emitting bare chips are electrically connected to the substrate body; and
   bending the substrate body from the plane shape to a fixed lampshade shape, wherein the fixed lampshade shape of the substrate body is held without external frame, wherein the substrate body with the fixed lampshade shape includes a plane portion, two extending portions extended upwardly from two opposite lateral sides of the plane portion, and two continuous concave portions respectively formed between the plane portion and one of the two extending portions and between the plane portion and the other extending portion, wherein the substrate body includes a positive trace and a negative trace, the positive trace is formed on the plane portion, one of the two extending portions, and one of the two continuous concave portions, and the negative trace is formed on the plane portion, the other extending portion, and the other continuous concave portion, wherein each light-emitting bare chip is electrically connected between the positive trace and the negative trace.

4. The method as claimed in claim 3, wherein the the substrate body with the fixed lampshade shape has a metal layer and a Bakelite layer formed on the metal layer.

5. A method for making an LED chip package structure, comprising the steps of:
   providing a substrate body having a plane shape;
   bending the substrate body from the plane shape to a fixed lampshade shape, wherein the fixed lampshade shape of the substrate body is held without external frame, wherein the substrate body with the fixed lampshade shape includes a plane portion, two extending portions extended upwardly from two opposite lateral sides of the plane portion, and two continuous concave portions respectively formed between the plane portion and one of the two extending portions and between the plane portion and the other extending portion, wherein the substrate body includes a positive trace and a negative trace, the positive trace is formed on the plane portion, one of the two extending portions, and one of the two continuous concave portions, and the negative trace is formed on the plane portion, the other extending portion, and the other continuous concave portion; and
   placing a plurality of light-emitting bare chips on the plane portion, wherein each light-emitting bare chip is electrically connected between the positive trace and the negative trace.

6. The method as claimed in claim 5, wherein the substrate body with the fixed lampshade shape has a metal layer and a Bakelite layer formed on the metal layer.

\* \* \* \* \*